United States Patent [19]

Fisher et al.

[11] Patent Number: 4,851,371
[45] Date of Patent: Jul. 25, 1989

[54] FABRICATING PROCESS FOR LARGE ARRAY SEMICONDUCTIVE DEVICES

[75] Inventors: Almon P. Fisher; Donald J. Drake, both of Rochester, N.Y.

[73] Assignee: Xerox Corporation, Stamford, Conn.

[21] Appl. No.: 280,104

[22] Filed: Dec. 5, 1988

[51] Int. Cl.⁴ ............... H01L 21/00; H01L 21/02; H01L 27/00; H01L 25/00
[52] U.S. Cl. ................... 437/226; 437/209; 148/DIG. 28
[58] Field of Search .............. 437/226; 148/DIG. 28

[56] References Cited

U.S. PATENT DOCUMENTS

| Re. 32,572 | 1/1988 | Hawkins et al. | 156/626 |
|---|---|---|---|
| 4,463,359 | 7/1984 | Ayata et al. | 346/1.1 |
| 4,542,397 | 9/1985 | Biegelsen et al. | 437/211 |
| 4,571,599 | 2/1986 | Rezanka | 346/140 R |
| 4,604,161 | 8/1986 | Araghi | 437/226 |
| 4,612,554 | 9/1986 | Poleshuk | 346/140 R |
| 4,638,337 | 1/1987 | Torpey et al. | 346/140 R |
| 4,678,529 | 7/1987 | Drake et al. | 156/234 |
| 4,774,530 | 9/1988 | Hawkins | 346/140 R |

FOREIGN PATENT DOCUMENTS 0157236  8/1985  Japan ..................... 437/226

Primary Examiner—Brian E. Hearn
Assistant Examiner—Byron S. Everhart
Attorney, Agent, or Firm—Robert A. Chittum

[57] ABSTRACT

A cost effective method of fabricating a large array or pagewidth silicon device having high resolution is disclosed. The pagewidth device is assembled by abutting silicon device sub-units such as image sensors or thermal ink jet printheads. For printheads, the sub-units are fully operational small printheads comprising an ink flow directing channel plate and a heating element plate which are bonded together. A plurality of individual printhead sub-units are obtained by dicing aligned and bonded channel wafers and heating element wafers. The abutting edges of the printhead sub-units are diced in such a manner that the resulting kerfs have vertical to inwardly directed sides which enable high tolerance linear abutment of adjacent sub-units. Alternatively, the wafer surface containing the heating elements is first anisotropically etched to form small V-grooves, one wall of which protects against microcracking during the dicing operation. The other wall of the V-groove is obliterated by the slanted dicing blade.

12 Claims, 9 Drawing Sheets

FABRICATING PROCESS FOR LARGE ARRAY SEMICONDUCTIVE DEVICES

BACKGROUND OF THE INVENTION

1. Field of the Invention

This invention relates to precision butting of semiconductive chips, and more particularly to an improved fabrication process for large array image sensors or thermal ink jet printheads, wherein sectioning of semiconductive wafers containing the sets of image sensors or heating element arrays to produce sub-units for assembly into pagewidth lengths include cutting two separate parallel lines in opposite directions by an angled dicing blade to produce kerfs with equal but opposite slopes.

2. Description of the Prior Art

Fabrication of pagewidth silicon devices, such as image sensor arrays having photosites and supporting circuity integrated onto a silicon substrate and thermal ink jet printheads having an etched silicon structure mated and bonded to a silicon substrate with heating elements and addressing electrodes, impose economically difficult fabricating processes on manufacturers because of the close tolerance requirement for the abutting edges of side-by-side sub-units assembled to produce the pagewidth devices. For although the standard technique of dicing or scribing and cleaving silicon wafers used by the semiconductive industry produces silicon devices or chips having reasonably controlled dimensions, the microscopic damage occurring to the chip surface during the scribing or dicing operation has effectively precluded the deposition of circuitry or photosites at the chip edge. This has necessitated that a safe distance be maintained between the last circuit element or photosite and chip edges, if operation of these adjacent photosites or ink jet circuitry is not to be impaired by the presence of either microcracks or silicon chipping along the cleaved or diced edges.

U.S. Pat. No. 4,604,161 to Araghi addressed this problem. Araghi discloses the concept of chemically etching a V-groove in the surface of a wafer followed by a partial cut in the back of the wafer forming an inside groove directly underneath the V-groove. This allows the dies to be separated from one another by means of a mechanical cleaving or breaking operation. In this approach, the cut through the top surface of the wafer, in which the active elements are built, was not made with an abrasive blade but by means of the chemically etched V-groove. As a result, the propagation of mechanical damage along the top surface of the wafer was avoided, allowing active elements to be placed as close to the V-groove as the accuracy of the photolithography and the etching operation would allow.

However, the Araghi technique leaves at least one face of the cleaved chip with a protruding knife edge defined by two intersecting {111} planes. This knife edge can be very delicate and easily damaged. Such damage may require that the chip be rejected, reducing fabrication yields and increasing cost.

Copending and commonly assigned patent application Ser. No. 090,827, filed Aug. 28, 1987, entitled "Method of Fabricating Image Sensor Dies For Use in Assembly Arrays", to Jedlicka et al, seeks to address and rectify the above by providing a method of fabricating high resolution image sensor dies from a silicon wafer so that the dies have precision vertical faces to enable the dies to be assembled with other like dies to form a larger array without image loss or distortion at the points where the dies are assembled together. Small V-shaped grooves are etched in one side of a (100) silicon wafer delineating the faces of the chips where the chips are to be separated from the wafer with the walls of the V-shaped grooves being parallel to the {111} crystalline planes of the wafer. Wide grooves are formed in the opposite side of the wafer opposite each of the V-shaped grooves with the axis of the wide grooves being parallel to the axis of the V-shaped groove opposite thereto. In the final process step, the wafer is sawed along the V-shaped grooves with one side of the cut made by the sawing being substantially coextensive with the bottom of the V-shaped grooves and perpendicular to the wafer surface. Accordingly, one side of the V-shaped grooves is obliterated by the sawing, and the sides of the V-shaped grooves that remain serve to prevent development of fractures in the die beyond the remaining side, as the wafer is sawed.

Thermal ink jet printing systems use thermal energy selectively produced by resistors located in capillary filled ink channels near channel terminating nozzles or orifices to vaporize momentarily the ink and form bubbles on demand. Each temporary bubble expels an ink droplet and propels it towards a recording medium. The printing system may be incorporated in either a carriage type printer or a pagewidth type printer. The carriage type printer generally has a relatively small printhead, containing the ink channels and nozzles. The printhead is usually sealingly attached to a disposable ink supply cartridge and the combined printhead and cartridge assembly is reciprocated to print one swath of information at a time on a stationarily held recording medium, such as paper. After the swath is printed, the paper is stepped a distance equal to the height of the printed swath, so that the next printed swath will be contiguous therewith. The procedure is repeated until the entire page is printed. For an example of a cartridge type printer, refer to U.S. Pat. No. 4,571,599 to Rezanka. In contrast, the pagewidth printer has a stationary printhead having a length equal to or greater than the width of the paper. The paper is continually moved past the pagewidth printhead in a direction normal to the printhead length and at a constant speed during the printing process. Refer to U.S. pat. No. 4,463,359 to Ayata et al for an example of pagewidth printing and especially FIGS. 17 and 20 therein.

U.S. Pat. No. 4,463,359 mentioned above discloses a printhead having one or more ink filled channels which are replenished by capillary action. A meniscus is formed at each nozzle to prevent ink from weeping therefrom. A resistor or heater is located in each channel upstream from the nozzles. Current pulses representative of data signals are applied to the resistors to momentarily vaporize the ink in contact therewith and form a bubble for each current pulse. Ink droplets are expelled from each nozzle by the growth of the bubbles which causes a quantity of ink to bulge from the nozzle and break off into a droplet at the beginning of the bubble collapse. The current pulses are shaped to prevent the meniscus from breaking up and receding too far into the channels, after each droplet is expelled. Various embodiments of linear arrays of thermal ink jet devices are shown, such as those having staggered linear arrays attached to the top and bottom of a heat sinking substrate for the purpose of obtaining a pagewidth printhead. Such arrangements may also be used for different colored inks to enable multi-colored printing.

U.S. Pat. No. Re. 32,572 to Hawkins et al discloses a thermal ink jet printhead and method of fabrication. In this case, a plurality of printheads may be concurrently fabricated by forming a plurality of sets of heating elements with their individual addressing electrodes on one substrate, generally a silicon wafer, and etching corresponding sets of channel grooves with a common recess for each set of grooves in another silicon wafer. The wafer and substrate are aligned and bonded together so that each channel has a heating element. The individual printheads are obtained by milling away the unwanted silicon material to expose the addressing electrode terminals and then dicing the substrate to form separate printheads.

U.S. Pat. No. 4,638,337 to Torpey et al discloses an improved printhead of the type disclosed in the patent to Hawkins et al wherein the bubble generating resistors are located in recesses to prevent lateral movement of the bubbles through the nozzles and thus preventing sudden release of vaporized ink to the atmosphere.

U.S. Pat. No. 4,678,529 to Drake et al discloses a method of bonding the ink jet printhead channel plate and heater plates together by a process which provides the desired uniform thickness of adhesive on the mating surfaces and prevents the flow of adhesive into the fluid passageways.

U.S. Pat. No. 4,612,554 to Poleshuk discloses an ink jet printhead composed of two identical parts, each having a set of parallel V-grooves anisotropically etched therein. The lands between the grooves each contain a heating element and its associated addressing electrodes. The grooved parts permit face-to-face mating, so that they are automatically self-aligned by the intermeshing of the lands containing the heating elements and electrodes of one part with the grooves of the other parts. A pagewidth printhead is produced by offsetting the first two mated parts, so that subsequently added parts abut each other and yet continue to be self-aligned.

U.S. Pat. No. 4,774,530 to Hawkins, discloses the use of an etched thick film insulative layer to provide the flow path between the ink channels and the manifold, and copending and commonly assigned patent application Ser. No. 126,085, filed Nov. 27, 1987, entitled "Thermal Ink Jet Printhead and Fabrication Method Therefor" to Campanelli et al, discloses the use of an etched thick film insulative layer between mated and bonded substrates. One substrate has a plurality of heating element arrays and addressing electrodes formed on the surface thereof and the other being a silicon wafer having a plurality of etched manifolds, with each manifold having a set of ink channels. The etched thick film layer provides a clearance space above each set of contact pads of the addressing electrodes to enable the removal of the unwanted silicon material of the wafer by dicing without the need for etched recesses therein. The individual printheads are produced subsequently by dicing the substrate having the heating element arrays.

Copending and commonly assigned patent application Ser. No. 137,283, filed Dec. 23, 1987, entitled "Large Array Thermal Ink Jet Printhead", to Drake et al, discloses a large array ink jet printhead having two basic parts, one containing an array of heating elements and addressing electrodes on the surface thereof, and the other containing the liquid ink handling system. At least the part containing the ink handling system is silicon and is assembled from generally identical sub-units aligned and bonded side-by-side on the part surface having the heating element array. Each channel plate sub-unit has an etched manifold with means for supplying ink thereto and a plurality of parallel ink channel grooves open on one end and communicating with the manifold at the other. The surfaces of the channel plate sub-units contacting each other are {111} planes formed by anisotropic etching. The channel plate sub-units appear to have a parallelogram shape when viewed from a direction parallel with and confronting the ink channel groove open ends. The heating element array containing part may also be assembled from etched silicon sub-units with their abutting surfaces being {111} planes. In another embodiment, a plurality of channel plate sub-units are anisotropically etched in a silicon wafer and a plurality of heating element sub-units are formed on another silicon wafer. The heating element wafer is also anisotropically etched with elongated slots. The wafers are aligned and bonded together, then diced into complete printhead sub-units which have abutting side surfaces that are {111} planes for accurate side-by-side assembly.

Drop-on-demand thermal ink jet printheads discussed in the above patents and pending applications are fabricated by using silicon wafers and processing technology to make multiple small heater plates and channel plates. This works extremely well for small printheads. However, for large array or pagewidth printheads, a monolithic array of ink channels or heating element arrays cannot be practically fabricated in a single wafer.

The fabrication approaches for making either large array or pagewidth thermal ink jet printheads can be divided into basically two broad categories; namely, monolithic approaches in which one or both of the printhead components (heater substrate and channel plate substrate) are a single large array or pagewidth size, or sub-unit approaches in which smaller sub-units are combined to form the larger array or pagewidth print bar. For examples of the sub-unit approach, refer to the above-mentioned U.S. Pat. No. 4,512,554 to Poleshuk, and in particular to FIG. 7 thereof, or the pending application Ser. No. 137,283 to Drake et al. The sub-units approach may give a much higher yield of usable sub-units, if they can be precisely aligned with respect to each other. The assembly of a plurality of sub-units, however, require precise individual registration in both the x-y-z planes as well as the angular registration within these planes. The alignment problems for these separate units presents quite a formidable task, the prior art solution of which makes this type of large array very expensive.

SUMMARY OF THE INVENTION

It is an object of the present invention to provide a fabrication process for large array semiconductive devices, such as image sensors or ink jet printheads, which will permit cost effective precision assembly using the sub-unit approach.

It is another object of this invention to provide a large array semiconductive device comprising a plurality of sub-units, each having abutting edges that are formed by the cutting of the adjacent sub-unit edges by an angled dicing blade which produces a kerf having a precise inward slope.

The present invention is described in the environment of a printhead assembled from aligned and mated silicon heating element plates and silicon ink flow directing channel plates, though other large array devices assembled from silicon sub-units, such as image sensors, are equally improved by this invention, and other semiconductive material such as, for example, gallium arsenide may be used instead of silicon. The heating element plates, each containing a linear array of heating elements and addressing electrodes, are obtained by a sectioning operation performed on a wafer having a plurality of sets of heating elements and associated addressing electrodes patterned on one surface thereof. The sides of the heating element plate, which are to be linearly abutted together to form the printhead, are sectioned by cutting along a cutting line with an angled dicing blade to produce a heating element side that slopes inwardly from the top surface. After the cut, the wafer is rotated 180° and a parallel second cut is made with the blade maintained at the same predetermined angle with respect to the wafer, so that the sides of the adjacent heating element plates also have inwardly sloping sides. Thus, each heating element plate has inwardly sloping side walls on the opposite sides which are to be abutted, and results in a heating element plate having a larger top surface than its bottom surface. The top surface is where the heating elements and addressing electrodes reside, and these top surfaces are substantially contiguous when abutted together, while the opposite bottom surfaces are separated from each other.

In the preferred embodiment of a large array printhead, the channel wafer, having a plurality of sets of etched parallel grooves and associated manifold recesses, is aligned and bonded to the heating element wafer having a plurality of sets of linear arrays of heating elements. The printhead electrode terminals are cleared by milling the channel wafer to remove the unwanted silicon. The individual printheads are obtained by a dicing operation which opens the channel ends opposite the manifold recess forming the nozzles in the freshly cut face and, by use of an angled dicing blade, forms the heating element plate edges having vertical to inwardly sloping sides for side-by-side abutment of fully operational printhead sub-units to produce the pagewidth printhead.

In another embodiment, the kerfs having vertical to sloping walls are produced by a circular dicing blade which bends as it contacts and cuts the heating element wafer, instead of angling the dicing blade relative to the water surface. After the first cut, the wafer is rotated 180° and a second cut is made along a spaced adjacent line parallel to the first kerf by the dicing blade with the same bend to produce a second kerf with vertical to inwardly slanted walls so that adjacent heating element plates may have from planar contact to substantially linear contact at their top surface while their bottom surfaces are spaced from each other.

The foregoing features and other objects will become apparent from a reading of the following specification in conjunction with the drawings, wherein like parts have the same index numerals.

DESCRIPTION OF THE PREFERRED EMBODIMENT

Figure 1:
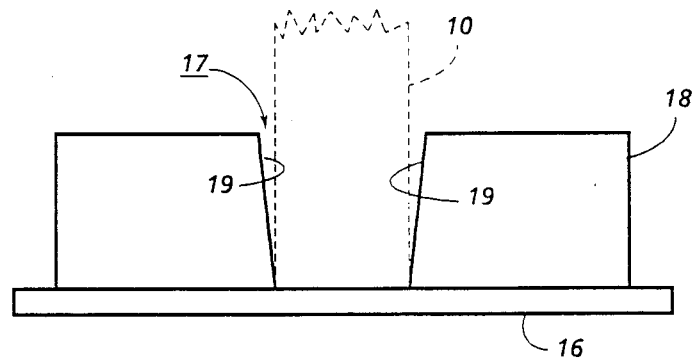
FIG. 1 is an enlarged, schematic cross-sectional view of a silicon wafer on a thin film frame showing a cut by a prior art dicing operation with the partially shown dicing blade in dashed line.

In FIG. 1, a prior art dicing cut 17 through a silicon wafer 18 approximately 20 mils thick is shown. In this figure, an enlarged, schematic cross-sectional view of the wafer 18 and cut or kerf 17 are depicted with the dicing blade 10 shown in dashed line. The wafer is releasably held by, for example, an adhesive in a film frame 16 that is about 2.5 mils thick. The walls 19 of the cut have a slope of about 15 microns for the 20 mil thick wafer. This slope is generally produced by the standard dicing operation and, though not desired, is tolerated by the semiconductive industry as the closest to vertical that can be achieved by dicing.

Figure 2:
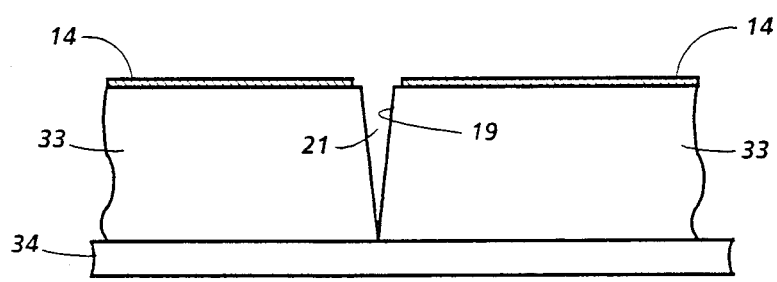
FIG. 2 is a partially shown, enlarged, schematic cross-sectional view of a pagewidth silicon device assembled from sub-units produced by dicing according to FIG. 1.

FIG. 2 is a partially shown, enlarged, schematic cross-sectional view of a pagewidth silicon device, such as, for example, an image sensing array, assembled from sub-units 33 produced by dicing a silicon wafer containing a plurality of imaging sensors 14 on the surface thereof. The image sensing sub-units 33 are fixedly mounted side-by-side on a pagewidth frame 34 with the image sensors 14 including supporting circuitry being on the upper exposed surface. The adjacent sloping walls 19 of the sub-units produce a gap 21 which prevents a high resolution pagewidth sensor array.

Figure 3:
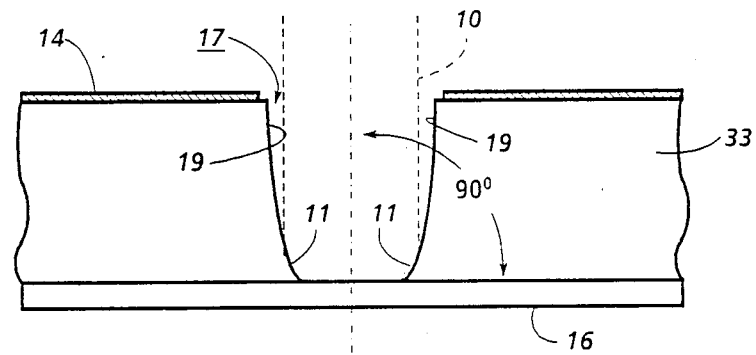
FIG. 3 is the same as FIG. 1, but showing a dicing cut by a worn dicing blade.
Figure 4:
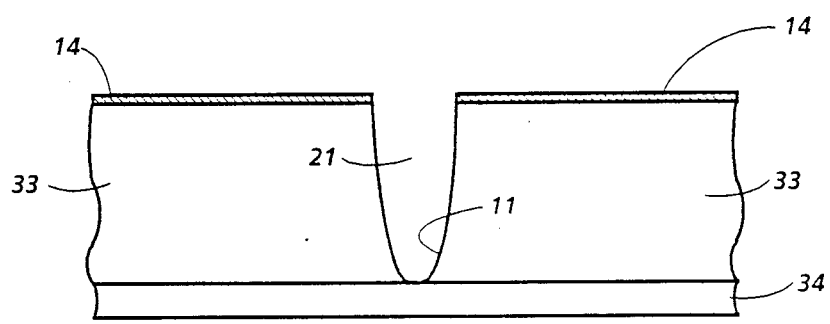
FIG. 4 is the same as FIG. 2, but showing the aggravated spacing problem encountered when silicon device sub-units are produced by worn dicing blades as shown in FIG. 3.

FIG. 3 is a view similar to that of FIG. 1 but having the plurality of sets of imaging sensors 14. The dicing blade 10, also shown in dashed line, is one that has been used, so that it has rounded edges which produce inwardly extending projections 11 at the base of both walls 19 of the cut 17 which compounds the printhead assembly tolerance problem as shown in FIG. 4. FIG. 4 is similar to FIG. 2, but shows that the projections 11 spread the gap 21 even more.

Figure 5:
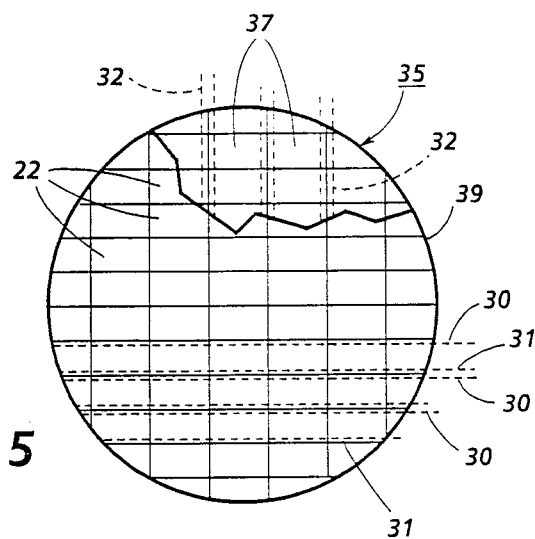
FIG. 5 is a schematic plan view of aligned and mated silicon wafers, the partially removed top wafer containing a plurality of etched channel plates with some of the horizontal dicing lines shown in dashed line and the exposed bottom wafer containing a plurality of sets of heating elements with some of the pairs of parallel vertical dicing lines shown in dashed line.
Figure 6:
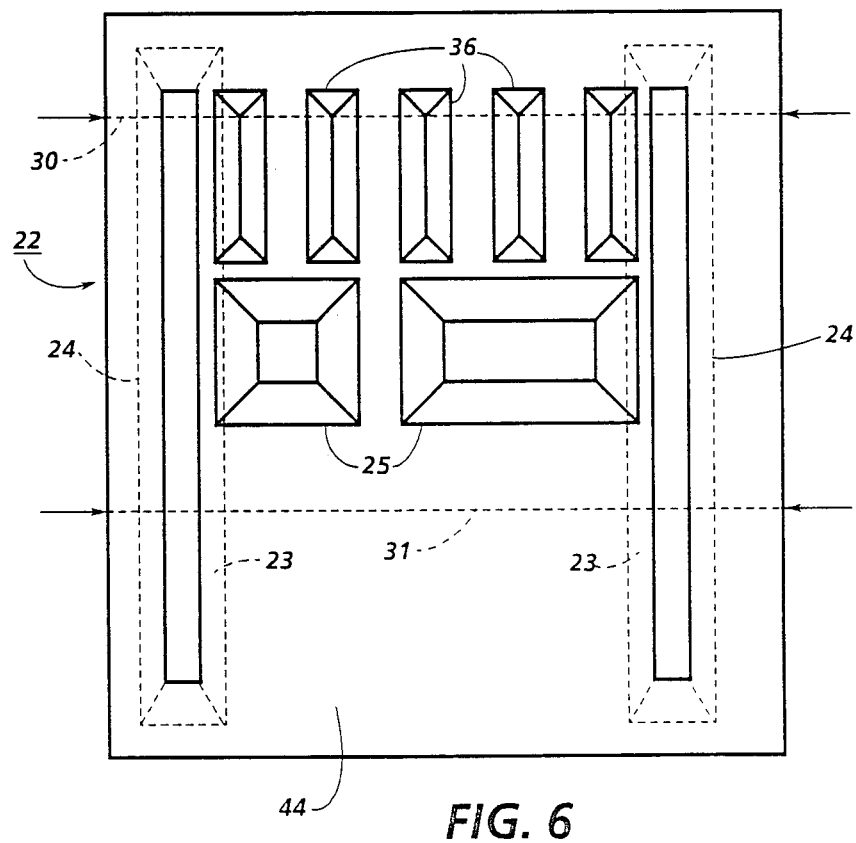
FIG. 6 is an enlarged schematic plan view of one channel plate with the horizontal dicing lines shown in dashed line.

In FIG. 5, a two side polished, (100) silicon wafer 39 is used to produce the plurality of channel plates 22 for mating with a heating element plate 37 to form a sub-unit 20 of a large array or pagewidth printhead 41 more fully discussed later. After the wafer 39 is chemically cleaned, a silicon nitride layer (not shown) is deposited on both sides. Using conventional photolithography, vias for elongated slots 24 (see FIG. 6) for each channel plate 22 are printed on the side of the wafer shown in FIG. 5. The silicon nitride is plasma etched off of the patterned vias representing the elongated slots. A potassium hydroxide (KOH) anisotropic etch is used to etch the elongated slots. In this case, the {111} planes of the (100) wafer make an angle of 54.7° with the surface of the wafer. These vias are sized so that they are entirely etched through the 20 mil thick wafer.

Next, the opposite side 44 of wafer 39 is photolithographically patterned, using the slots 24 as a reference to form the plurality of sets of channel grooves 36, and one or more fill holes 25 per set of channel grooves. This fabricating process requires that parallel milling or dicing cuts be made later which are perpendicular to the channel grooves 36. One dicing cut is made at the end of the channel grooves 36 opposite the ends adjacent the fill hole, as indicated by dashed line 30. Another one is made on the opposite side of the fill holes, as indicated by dashed line 31, in order to obtain a channel plate with sloping sides 23 produced by the anisotropic etching. The fill holes 25 may be placed into communication with the ink channels 36 by isotropic etching as taught in U.S. Pat. No. Re. 32,572 referenced above or by etching flow paths in a thick film layer on the heating element plates as taught by U.S. Pat. No. 4,774,530 to Hawkins.

Figure 9:
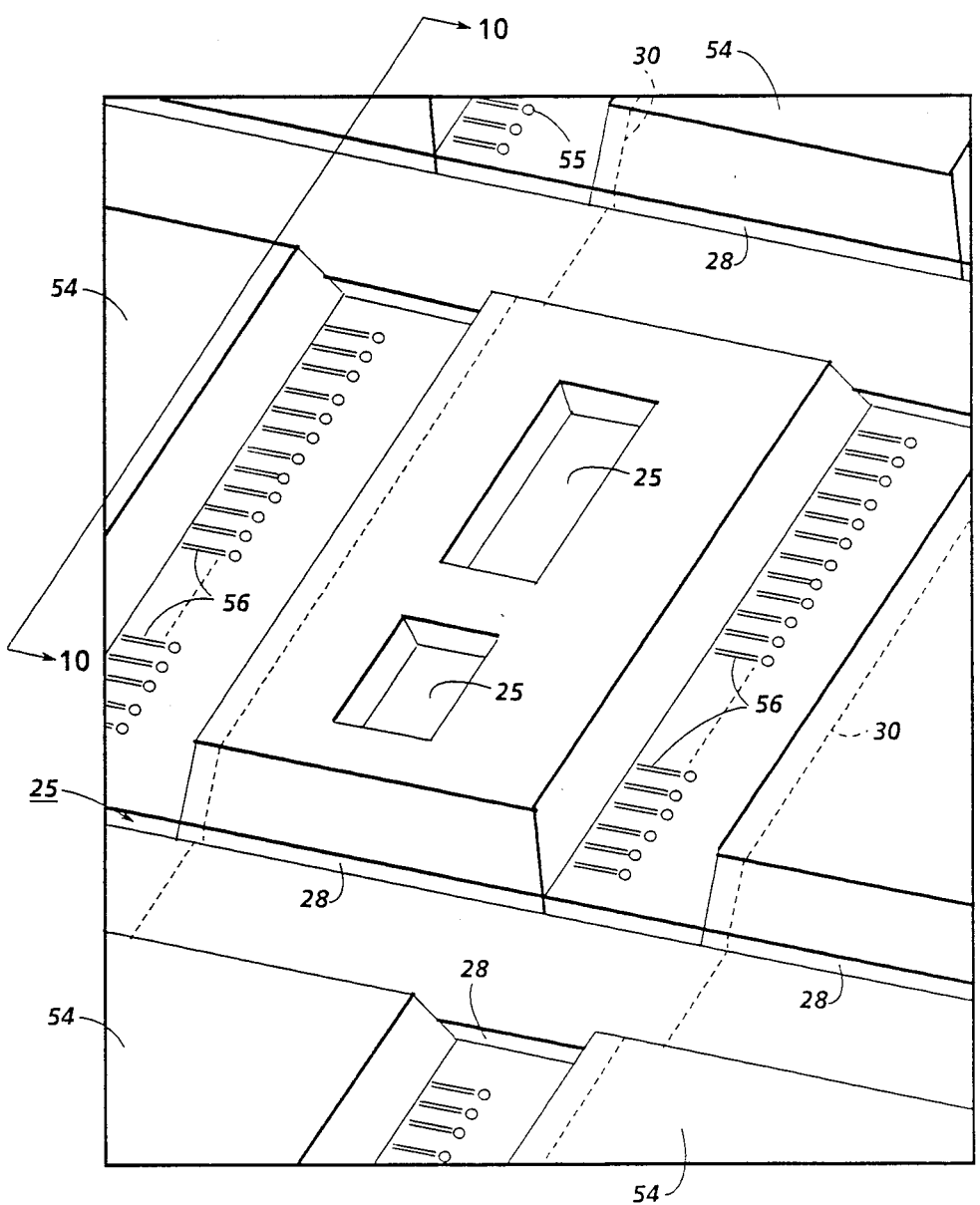
FIG. 9 is an enlarged isometric view of the channel wafer bonded to the heating element wafer after the unwanted channel wafer material has been removed to expose the electrode terminals and after the oppositely slanted, parallel kerfs have been produced.

A plurality of sets of heating elements with addressing electrodes 56 (see FIG. 9) are formed on one surface of substrate 35, which may also be a silicon wafer by means well known in the art. This substrate or wafer 35 is aligned and mated to the etched channel wafer 39 as taught by U.S. Pat. No. Re. 32,572, and then dicing cuts are made to remove unwanted silicon wafer material from wafer 39 in order to expose the heating element electrode terminals 55 on wafer 35. Referring to FIG. 9, an isometric view of the mated wafers is shown before the final dicing operation is conducted along dicing line 30 to produce the printhead subunits 20 and concurrently open the nozzles 15. Each portion or heating element plate 37 of wafer 35 contains a set of heating elements and addressing electrodes, and has a remaining channel plate portion 54 bonded thereto, as explained later. Pairs of dicing lines 32, shown in dashed lines in FIG. 5 and shown as kerfs 27, 28 in FIG. 9 delineate how the wafer 35 is cut into fully operational printhead sub-units 20 when dicing along cutting line 30 is accomplished.

Figure 7:
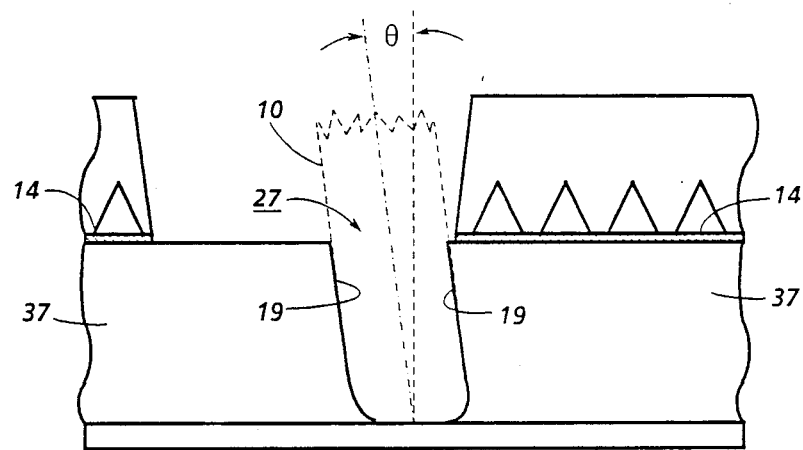
FIG. 7 is a partially shown, enlarged, schematic cross-sectional view of the heating element and channel wafers of FIG. 5 showing a first kerf cut by an angled dicing blade, the blade being shown in dashed line.
Figure 8:
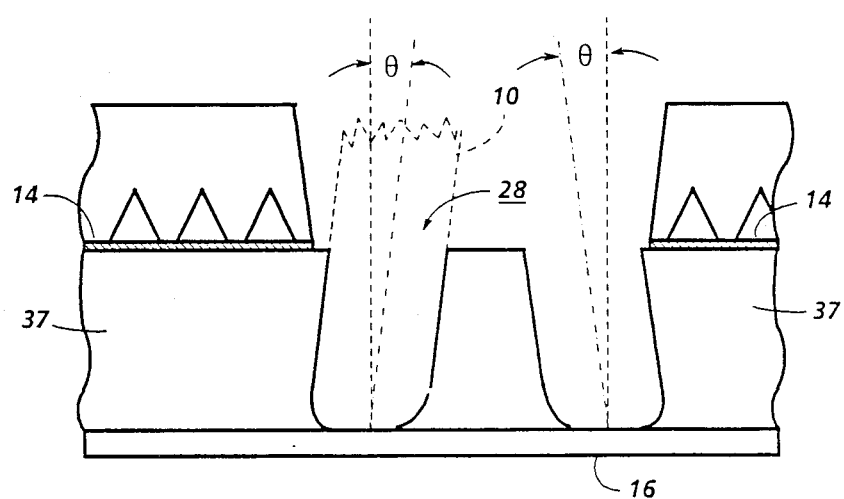
FIG. 8 is the same view as FIG. 7, but showing the second kerf after a second cutting by the angled dicing blade of FIG. 7 and the wafers rotated 180°, so that each kerf has an identical, but oppositely directed inward slope.
Figure 11:
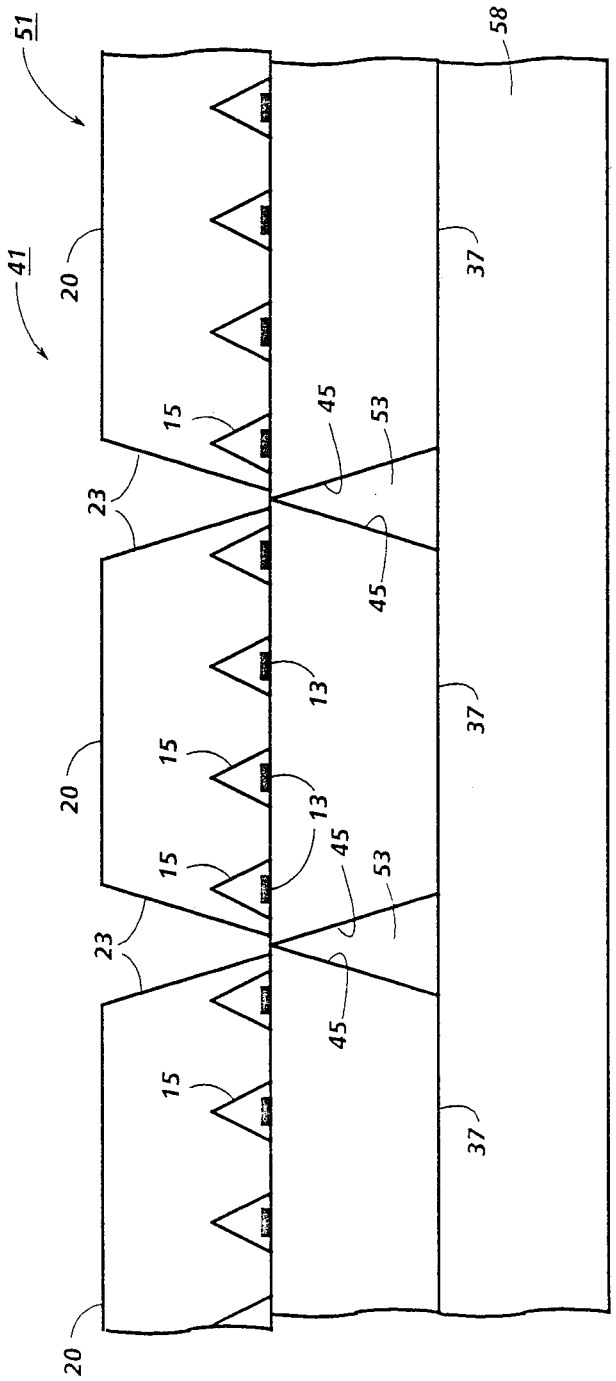
FIG. 11 is an enlarged, partially shown front view of a pagewidth printhead formed from printhead sub-units produced by the dicing operation shown in FIGS. 7 and 8.

The dicing operation for sectioning wafer 35 includes dicing along pairs of lines 32. The dicing along lines 32, by means discussed below, concurrently prepares the opposing sides of the heating element plate 37 of printhead sub-unit 20 for subsequent abutment to form a pagewidth printhead. The dicing along lines 32 is shown in FIGS. 7 and 8. In FIG. 7, a single angled cut 27 is shown between heating element arrays (not shown) and their addressing electrodes 14. This cut is produced by a resinoid dicing blade 10, depicted in dashed line, which has the blade angled to a predetermined angle "$\theta$" by using a modified dicing chuck (not shown) which will enable the tilting of the wafer so that the dicing blade is angled with respect to wafer surface. In the preferred embodiment, this angle $\theta$ is in the range of 0 to 60 microns per 20 mils of silicon wafer thickness from a direction normal to the wafer 35 or between 0 and 0.002 degrees. Preferably, angle $\theta$ is more than 0 degrees. This method of cutting by the angled dicing blade produces a kerf 27 having walls 19 that are generally at the same angle $\theta$, though the top of the kerf near the electrodes 14 is slightly larger than the bottom because of the ordinary vibration or wobble of the rotating dicing blade. FIG. 8 shows a second angled cut by the same angled blade, along a separate, parallel dicing line, but with the mated wafers 35, 39, rotated 180°. Thus, each of the resulting pairs of kerfs 27, 28 have identical but oppositely directed slopes, so that when the resulting sub-units 20 are assembled as shown in FIG. 11, the surface of the adjacent heating element plates 37 (which have the heating elements and addressing electrodes) are in contact, while their bottom surfaces are slightly spaced from each other. This method of angled sectioning or dicing must be aligned precisely with the dicing chuck, and the elevation or Z-axis location must be revised for each cut to compensate for any rise in the surface of the wafer because of the tilting of the wafer.

Figure 12:
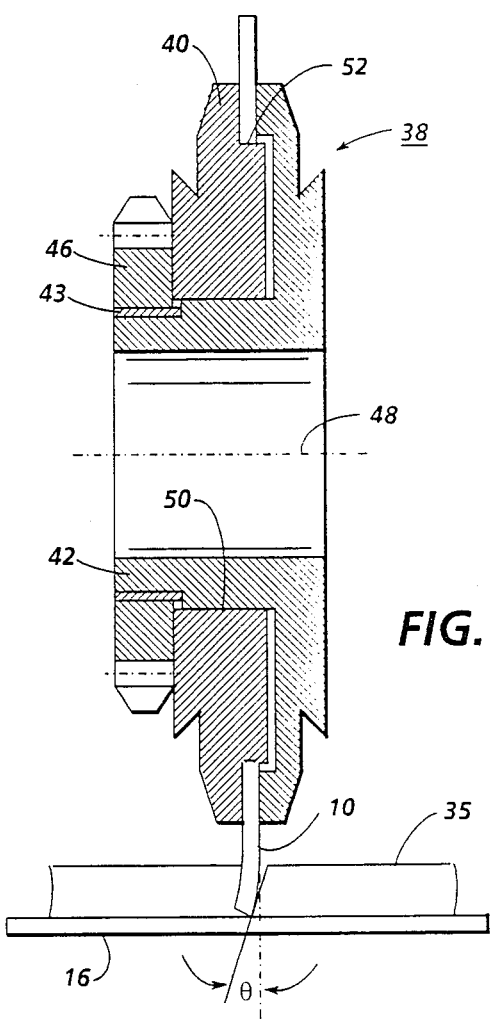
FIG. 12 is a cross-sectional, schematic view of a dicing blade and flange depicting an alternate method of producing a slanted kerf.

The angled dicing cuts can be achieved by using a second preferred method. The second method is to use the bending feature of the dicing blade 10 as shown in FIG. 12. The resin bonded blade 10 bends between 0 and 20 micrometers when in contact with and cutting through a 20 mils thick silicon wafer. Normally, small amounts of bending of the blade have no significance for gross cuts. However, for precise cuts, blade bending of resin bonded blades can result from several factors that make precision cutting more difficult than with a more rigid metal bonded blade. Predictable dicing blade bending occurs when the factors, discussed below, are controlled.

Blade thickness, blade exposure, depth of cut, and feed rate are the primary factors or parameters that produce bending of the dicing blade. By feed rate it is meant the speed the blade moves or cuts through the silicon wafer. The same parameters will produce the same bending in amount and direction for any given resin bonded blade. Cuts made using these parameters are found to produce kerfs varying from a perfectly vertical wall to walls that slant slightly inward, providing walls that allow unhindered butting as shown in FIG. 11. Making vertical to angled cuts is routinely accomplished using this method when dicing thermal ink jet heating element plates or other similar plates or die.

Figure 13:
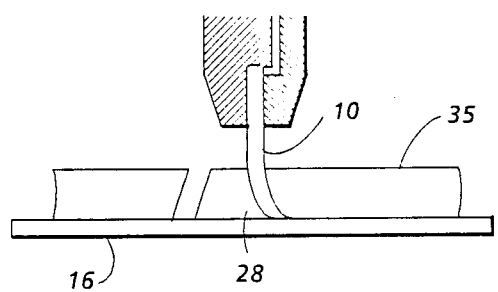
FIG. 13 is a view similar to that of FIG. 8, but produced by the dicing technique of FIG. 12.

Referring to FIGS. 12 and 13, a cross-sectional view of a typical circular dicing blade flange 38 is shown. The flange is rotated about axis 48 on a shaft not shown, and comprises an outer flange 42 and inner flange 40. The outer flange has a hub 50 upon which the inner flange 40 is mounted. The circular dicing blade 10 is mounted on a shoulder 52 of the inner flange and held fast between the inner and outer flanges by a nut 46 screwed tightly on threads 47 on the distal end of the outer flange hub 50. As the blade saws through the heating element wafer 35, held stationary during the dicing operation by film frame 16, the portion in contact with the heating element wafer slightly bends as shown by the angle $\theta$. FIG. 13 shows the dicing blade 10 cutting along a second parallel dicing line (second of dicing line pairs 32) but with the heating element wafer (channel wafer omitted for clarity) rotated 180° to produce a pair of kerfs 27, 28, each of which are equally slanted in opposite directions.

Among the factors contributing to blade bending of a resin bonded blade is it thickness and the depth of the cut by the blade. The depth of cut factor is generally expressed as the ratio of blade exposure (i.e., the radial distance of the circular blade exposed or extending from the flange) to blade thickness. Typically this ratio is 10:1 to 8:1. In the preferred embodiment, a five mil thick resin bonded blade is used with a ratio of 6:1. Other blade bending factors include a side force on the blade when approaching the round edge of the wafer and a side force generated by an unevenly worn cutting edge.

The error due to the blade approaching the round edge of the wafer can be as much as ±10 micrometers with a six mil thick resin bonded blade. By cutting a chord (not shown) from the heating element wafer, the resin bonded blade may approach a straight edge in a direction normal thereto and remove one factor which causes blade bending. Error due to an unevenly worn resin bonded blade can be as much as ±24 micrometers with a six mil thick blade and ±5 micrometers with an eight mil thick blade. This error is eliminated by dressing the blade before each heating element wafer is diced.

Therefore, by cutting mutually perpendicular flats on the heating element wafer (not shown), so that the resin bonded dicing blade approaches the wafer edge in a direction normal to the flat edge, and by dressing the cutting edge of the blade each time a new heating element wafer is diced into a plurality of individual heating element plates, the side forces which would cause unwanted blade bending is eliminated. The bending is caused substantially totally from the dicing parameters discussed above. Thus, the bending produced is in that portion of the blade contacting the wafer during the dicing operation and provides kerfs which are either precisely vertical or slanted inwardly, whereby a second dicing operation along a second parallel dicing line with the wafer rotated 180° provides a second kerf which is identical to the first except, if slanted, it has an oppositely directed slope. Thus, each of the kerfs are precisely vertical or have an inward slant from the top, so that they may be closely abutted to form pagewidth devices.

The isometric view of the mated channel and heat element wafers are shown in FIG. 9 after the unwanted silicon of wafer 39 that covers the addressing electrode terminals on wafer 35 have been removed. This removal of silicon from one wafer without damaging the terminals on the other wafer is disclosed in the patents and pending applications discussed above. The pairs of dicing cuts along dicing line pairs 32 have also been conducted and oppositely sloping kerfs 27, 28 are shown parallel with and adjacent the slanted channel plate sides 23 of the remaining portions 54 of the channel plates 22. As discussed earlier, the channel plate sides were formed by anisotropic etching, so that they are {111} crystal planes. The {111} planes have an angle with the surface of the channel wafer of about 54.7 degrees. This slope enables angling of the dicing blade to provide the slanted kerfs 27, 28. The dicing along line 30 remains to be accomplished and this dicing operation not only produces a plurality of printhead sub-units 20, but concurrently opens the channel grooves or recesses 36 to provide nozzles 15.

Figure 10:
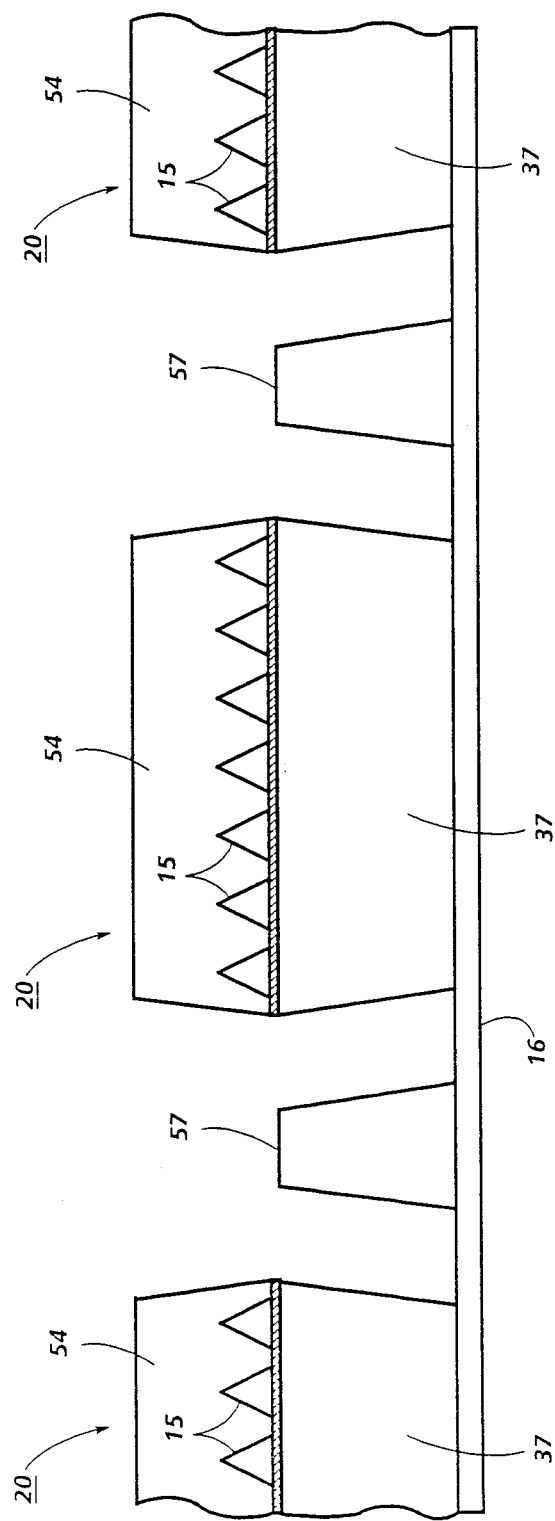
FIG. 10 is a schematic cross-sectional view of FIG. 9 as viewed along view line A—A which is coincident with dicing line 30 as shown in dashed line.

FIG. 10 is a cross-sectional view of the mated channel and heating element wafers of FIG. 9 as viewed along view line A—A, which view line is coincident with dicing line 30. This view shows the completely operational printhead sub-units 20 with the nozzles 15 facing the viewer. Each printhead sub-unit is composed of the remaining portion 54 of the channel plate and heating element plate 37. The portion 57 of heating element wafer 35 located between pairs of oppositely sloping kerfs 28 is to be discarded. The printhead sub-units 20 and portion 57 of the heating element wafer 35 are lastly removed from the standard film frame 16.

FIG. 11 is an enlarged, partially shown view of a pagewidth ink jet printhead 41 that is assembled from printhead sub-units 20. Schematically illustrated heating elements 13 are shown in each channel through nozzles 15. The confronting walls 45 of the heating element plates 37 were produced by the angled dicing along dicing lines 32 and enable the close tolerance abutting of the printhead sub-units 20. The top surfaces of the heating element plates 37 having the heating elements and addressing electrodes (not shown) have substantially linear contact and present a contiguous surface. The oppositely sloping walls 46 leave gaps 53, because the bottom surface of the heating element plates 37 are smaller than the top surfaces. The pagewidth printhead 41 is assembled on a support structure 58, which also acts as a heat sink.

To strengthen the printhead 41, the gaps 53 between the heating element plates 37 specifically generated by the slanted kerfs 27, 28 may be optionally filled (not shown) with flowable epoxy or other suitable adhesives.

Figure 14:
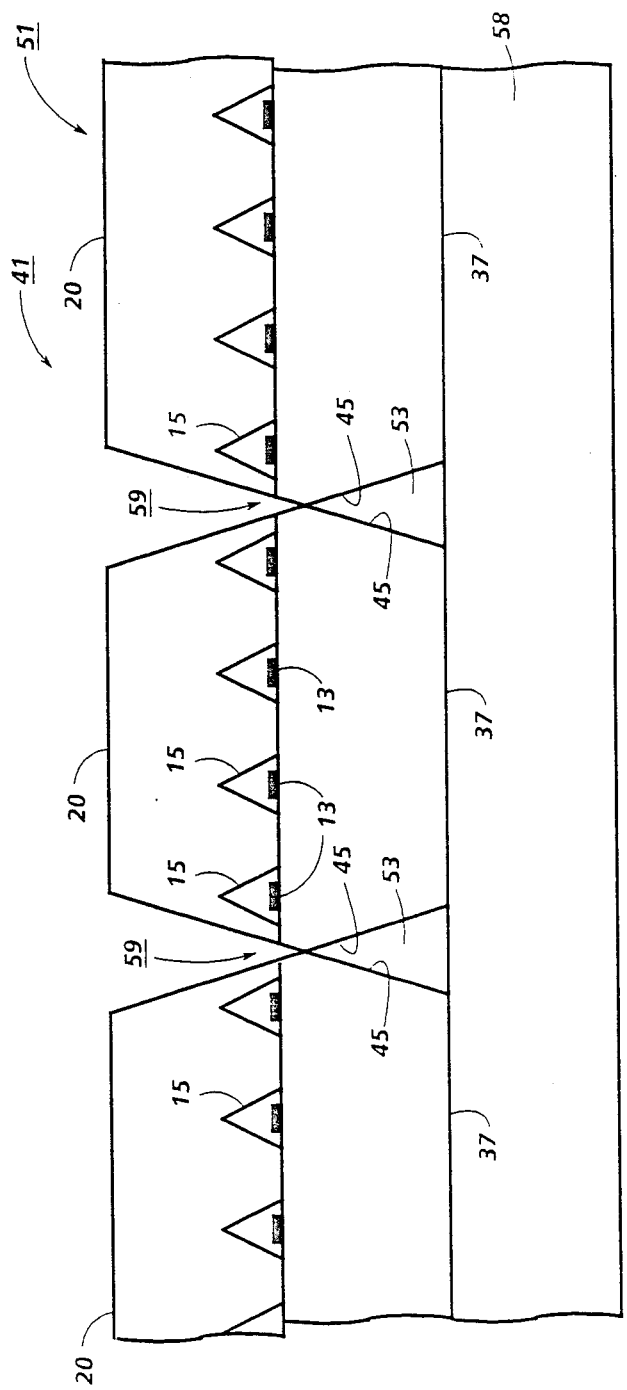
FIG. 14 is an alternate embodiment of FIG. 11 showing of a V-groove in the surface of the adjoining printhead sub-units.

FIG. 14 is an alternate embodiment of FIG. 11 and shows only the abutting regions of adjacent sub-units 20. in this embodiment, a very small V-groove 59 is anisotropically etched in the surface of the heating element wafer 35, so that the slanted dicing to produce slanted walls 45 do not cut through the surface containing the heating elements and supporting electrodes or circuitry. This eliminates all microcracking because the dicing blade only cuts outside of the {111} plane of the small V-groove 59.

As discussed above with reference to FIGS. 12 and 13, precise bending of resin dicing blades by controlling the parameters of blade thickness, blade exposure, depth of cut, and feed rate enables precision vertical-walled kerfs as well as those with slight inward slopes. Thus, kerfs produced by precision resin blade bending provides the best control of the interfacing edges of abutted printhead sub-units 20, because planar contact to not more than line contact at the top of the abutting edges is available.

Many modifications and variations are apparent from the foregoing description of the invention and all such modifications and variations are intended to be within the scope of the present invention.

We claim:

1. A method of fabricating high resolution, large array semiconductive devices from the linear abutment of sub-units, each subunit having a planar semiconductive substrate with at least one component and supporting circuitry on a surface thereof and being obtained by the dicing of a semiconductive wafer containing of a surface thereof horizontal rows and vertical columns of said components with supporting circuit, said dicing being conducted along mutually perpendicular dicing lines between the rows and columns of components, so that said sub-units have precision surface edges to enable the sub-units to be abuttingly assembled with other sub-units to form a pagewidth array without loss of tolerance or resolution between adjacent sub-units in the large array, comprising the steps of:

(a) sectioning the semiconductive wafer along parallel cutting lines between each two columns and one of the outermost columns of components and supporting circuitry formed on one of the surfaces thereof with a circular dicing blade, after adjusting the relative angular position of the dicing blade with respect to the wafer surface containing the components, so that the dicing blade produces a first slanted kerf through the semiconductive wafer along each cutting line, each of the first kerfs being slightly inwardly slanted at a predetermined angle $\theta$ and located closely adjacent one column of components and spaced from the other column of components when cutting is between columns;

(b) turning the semiconductive wafer 180° and repeating step (a) along a parallel, separate cutting lines between the same columns and the other outermost column of components to produce a second kerf with the dicing blade at the same predetermined angular position, but with the opposite orientation, and located closely adjacent the columns of components that are further in distant from the first kerf, so that each column of components have inwardly directed kerfs on each side thereof;

(c) dicing along parallel cutting lines between each row of components and supporting circuitry with the dicing blade generally normal to the semiconductive wafer and in a direction perpendicular to the first and second kerfs to produce a plurality of individual sub-units; and (d) fixedly abutting the sub-units with their confronting edges being produced by the inwardly slanted kerfs, so that they are in precise linear contact at the surface of the sub-units' planar substrate containing the components, while the opposite surfaces of sub-units' planar substrates are spaced apart.

2. The method of claim 1, wherein the sub-units are image sensors and the components are linear arrays of photosites; and wherein the semiconductive wafer and thus the planar semiconductive substrate is silicon or gallium arsenide.

3. The method of claim 1, wherein the sub-units are fully functional thermal ink jet printheads and the components thereof are ink flow directing silicon channel plates having parallel ink channels in communication with a manifold on one end and open at the other end, the channel plates being produced from anisotropically etched silicon wafers; wherein the supporting circuitry for each component or channel plate is a set of heating elements and passivated addressing electrodes which are formed on a surface of the planar semiconductive substrate with the channel plates aligned and bonded thereover, so that each ink channel contains a heating element; and wherein the semiconductive wafer and thus the planar semiconductive substrate is silicon.

4. The method of claim 3, wherein the channel plates have oppositely sloped side surfaces which follow the {111} crystal planes oriented in a direction parallel to the ink channels, so that in cross section they appear trapezoidal in shape, the oppositely sloped, channel plate side surfaces being necessary to provide ample clearance for the relatively slanted dicing blade.

5. The method of claim 4, wherein the predetermined angle $\theta$ is within the range of that produced by 0 to 60 $\mu$m per 20 mils (500 $\mu$m) or angle of 0 to 0.002 degrees.

6. The method of claim 1, wherein step (a) further comprises maintaining the dicing blade vertical and using an adjustable wafer holding chuck for tilting the wafer relative to the dicing blade to obtain a slanted kerf; and wherein step (b) further comprises adjusting the elevation of the holding chuck and thus the semiconductive wafer to compensate for any rise in the surface of the semiconductive wafer because of the tilting thereof.

7. The method of claim 6, wherein the semiconductive wafer is silicon; and wherein the predetermined angle $\theta$ is 0 to 0.002 degrees.

8. The method of claim 1, wherein the adjusting of the relative angular position of the dicing blade with respect to wafer surface is accomplished by use of a resin bonded dicing blade; and wherein the method further comprises the steps of: selecting an appropriate ratio of blade exposure to blade thickness, so that when combined with appropriate depth of cut and speed of cut the resin bonded dicing blade will have the desired bend therein and enable the desired slope to a kerf produced by the use thereof during dicing of the wafer.

9. The method of claim 8, wherein the thickness of the resin bonded dicing blade is five mils and the ratio of blade exposure to blade thickness is 6:1.

10. The method of claim 9, wherein the method further comprises the steps of: cutting mutually perpendicular flats on the wafer so that the resin bonded dicing blade approaches the wafer edge in a direction normal to the flat edge and eliminates the error caused by the initial contact of a resin bonded blade with a curved wafer edge.

11. The method of claim 10, wherein the method further comprises the steps of: periodically dressing the edge of the resin bonded blade to maintain a square blade edge and prevent undesired blade bending errors induced by a worn blade edge.

12. The method of claim 8, wherein the further comprises the steps of: anisotropically etching relatively small parallel V-grooves in the surface of the silicon wafer adjacent each column of channel plates prior to the placement of the channel plates thereon; and when dicing said slanted kerfs parallel to the V-grooves, aligning the dicing blade so that it removes only the V-groove wall further from the channel plates during the dicing operation, whereby the remaining V-groove wall prevents microcracking at the surface containing the addressing electrodes.

* * * * *